United States Patent
Lee et al.

(10) Patent No.: US 11,145,373 B1
(45) Date of Patent: Oct. 12, 2021

(54) METHOD FOR PROGRAMMING FLASH MEMORY DEVICE AND FLASH MEMORY SYSTEM

(71) Applicant: MACRONIX International Co., Ltd., Hsinchu (TW)

(72) Inventors: Ya-Jui Lee, Taichung (TW); Kuan-Fu Chen, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/882,071

(22) Filed: May 22, 2020

(51) Int. Cl.
G11C 16/10 (2006.01)
G11C 16/04 (2006.01)
G11C 16/08 (2006.01)
G11C 16/30 (2006.01)

(52) U.S. Cl.
CPC .......... *G11C 16/10* (2013.01); *G11C 16/0483* (2013.01); *G11C 16/08* (2013.01); *G11C 16/30* (2013.01)

(58) Field of Classification Search
CPC ..... G11C 16/10; G11C 16/0483; G11C 16/30; G11C 16/08
See application file for complete search history.

(56) References Cited

U.S. PATENT DOCUMENTS

| | | | |
|---|---|---|---|
| 8,045,384 B2* | 10/2011 | Dong | G11C 16/10 365/185.17 |
| 9,064,545 B2* | 6/2015 | Cho | G11C 16/0483 |
| 9,406,368 B2 | 8/2016 | Bose et al. | |
| 9,905,301 B2* | 2/2018 | Yoo | G11C 16/28 |
| 2017/0133096 A1 | 5/2017 | Yoo et al. | |
| 2017/0242632 A1* | 8/2017 | Cho | G06F 3/0688 |

FOREIGN PATENT DOCUMENTS

CN 105009218 10/2015

OTHER PUBLICATIONS

"Office Action of Taiwan Counterpart Application", dated Jan. 25, 2021, pp. 1-7.
"Office Action of Taiwan Counterpart Application", dated Nov. 30, 2020, p. 1-p. 8.

* cited by examiner

*Primary Examiner* — Gene N Auduong
(74) *Attorney, Agent, or Firm* — J.C. Patents

(57) ABSTRACT

A method for programming a memory device and a memory system are provided, wherein the method for programming the memory device includes steps below. First, a program command is proposed. Second, a width of a pulse about to provide to strings of memory cells of the memory device is determined according to a temperature data of the memory device. Then, the pulse is provided to the strings of memory cells to start doing a program operation. The width of the pulse becomes narrower as a temperature of the memory device is raised.

10 Claims, 7 Drawing Sheets

US 11,145,373 B1

METHOD FOR PROGRAMMING FLASH MEMORY DEVICE AND FLASH MEMORY SYSTEM

BACKGROUND OF THE INVENTION

1. Field of the Invention

The present invention relates to a semiconductor device and an operation method thereof, in particular to a method for programming a memory device and a memory system.

2. Description of Related Art

When a program operation is carried out on a memory device, selected word lines in the memory device will be applied with program pulses so as to be supplied to selected memory cells. A suppression voltage is generally applied to a memory string where unselected memory cells on the same word line are located to make the unselected memory cells have a relatively high channel potential so as to avoid generation of a Fowler-Nordheim (FN) tunneling effect by the unselected memory cells. However, when the program operation is carried out on the memory device at a high temperature, a leak current generated by memory cells is relatively large, so that a channel potential of the unselected memory cells is gradually decreased in a process of carrying out the program operation, and the unselected memory cells are subjected to serious program interference finally.

FIG. 1 shows a voltage oscillogram of a memory device in the prior art when a program operation is carried out. As shown in FIG. 1, a width BW_C of pulses (including a program pulse VPGM_C and a pass pulse VPASS_C) applied to word lines does not change with a temperature, therefore, when the program operation is carried out on the memory device in the prior art at a high temperature, a value of a channel potential Vch_C of unselected memory cells on the selected word line will be gradually decreased from Vch_C1 to Vch_C2 due to generation of a relatively large leak current, and the channel potential has a relatively large decrease amplitude amount ΔVch_C. This will make the unselected memory cells on the same word line be affected, thereby reducing an ability to prevent program interference.

SUMMARY OF THE INVENTION

The present invention provides a method for programming a memory device and a memory system, which can prevent unselected memory cells from subjecting program interference.

The method for programming the memory device of the present invention includes steps below. First, a program command is proposed. Second, a width of a pulse about to provide to strings of memory cells of the memory device is determined according to a temperature data of the memory device. Then, the pulse is provided to the strings of memory cells to start doing a program operation. The width of the above pulse becomes narrower as a temperature of the memory device is raised.

The memory system of the present invention includes a memory device, a controller and a temperature sensor. The memory device includes a memory cell array, an address decoder, a voltage generator, a page buffer and a control logic. The memory cell array includes a plurality of strings of memory cells. The address decoder is coupled to the memory cell array. The voltage generator is coupled to the address decoder, and configured to generate a pulse provided to the strings of memory cells. The page buffer is coupled to the memory cell array. The control logic is coupled to the address decoder, the voltage generator and the page buffer. The controller is coupled to the memory device and configured to propose a program command to the memory device. The temperature sensor is configured to acquire a temperature data of the memory device, wherein the temperature sensor is located in the memory device or the controller. The above control logic determines a width of the pulse about to provide to the strings of memory cells of the memory device according to the temperature data of the memory device. The width of the above pulse becomes narrower as a temperature of the memory device is raised.

Based on the foregoing, according to the method for programming the memory device of the present invention, the width of the pulse applied to the strings of memory cells becomes narrower as the temperature of the memory device is raised, therefore, when the program operation is carried out on the memory device of the present invention at a high temperature, a decrease amplitude amount of a channel potential of the unselected memory cells is relatively small so as to make the unselected memory cells have an ability to avoid program interference.

DESCRIPTION OF THE EMBODIMENTS

Figure 1:
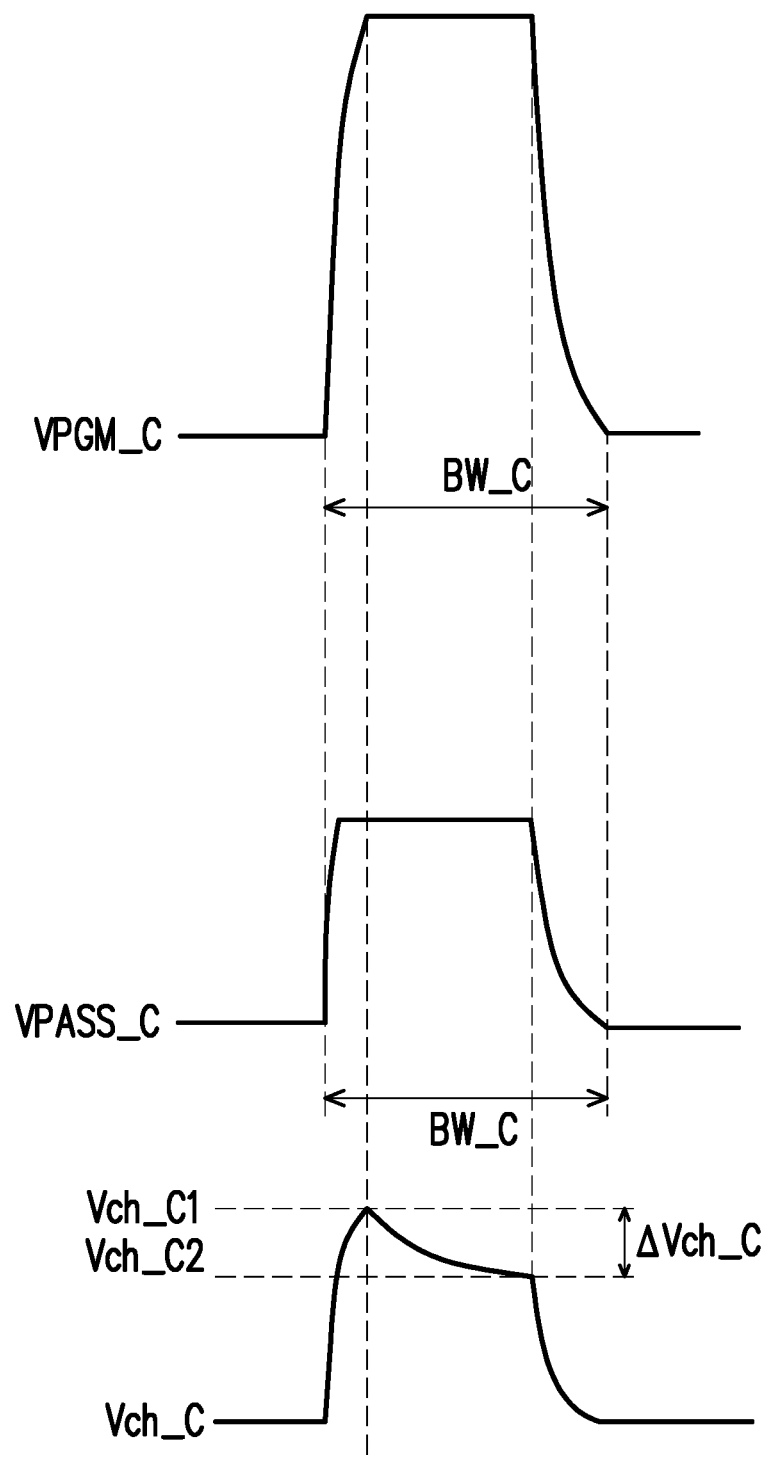
FIG. 1 is a voltage oscillogram of a prior memory device when a program operation is carried out.
Figure 2:
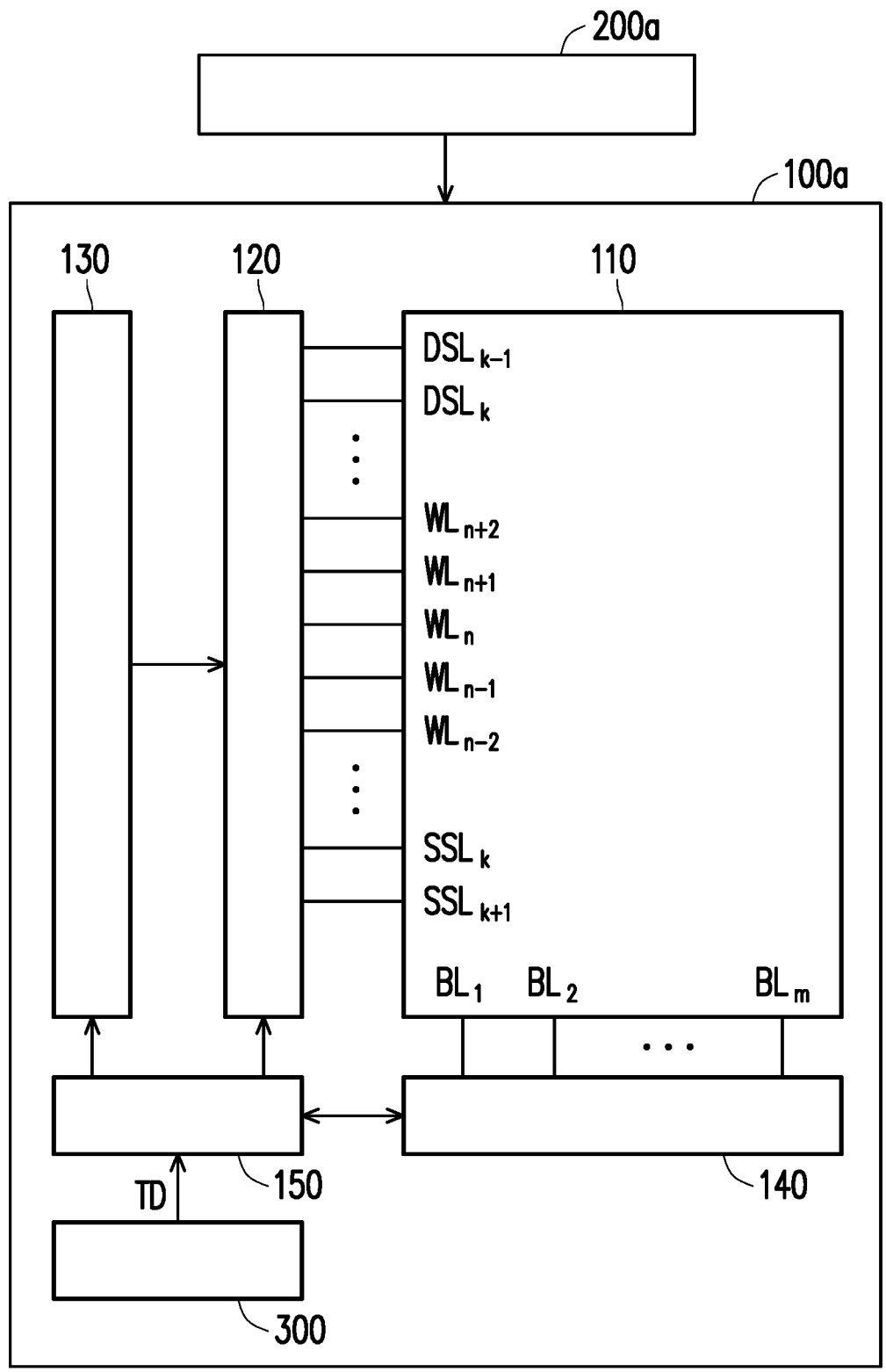
FIG. 2 shows a memory system according to an embodiment of the present invention.
Figure 3:
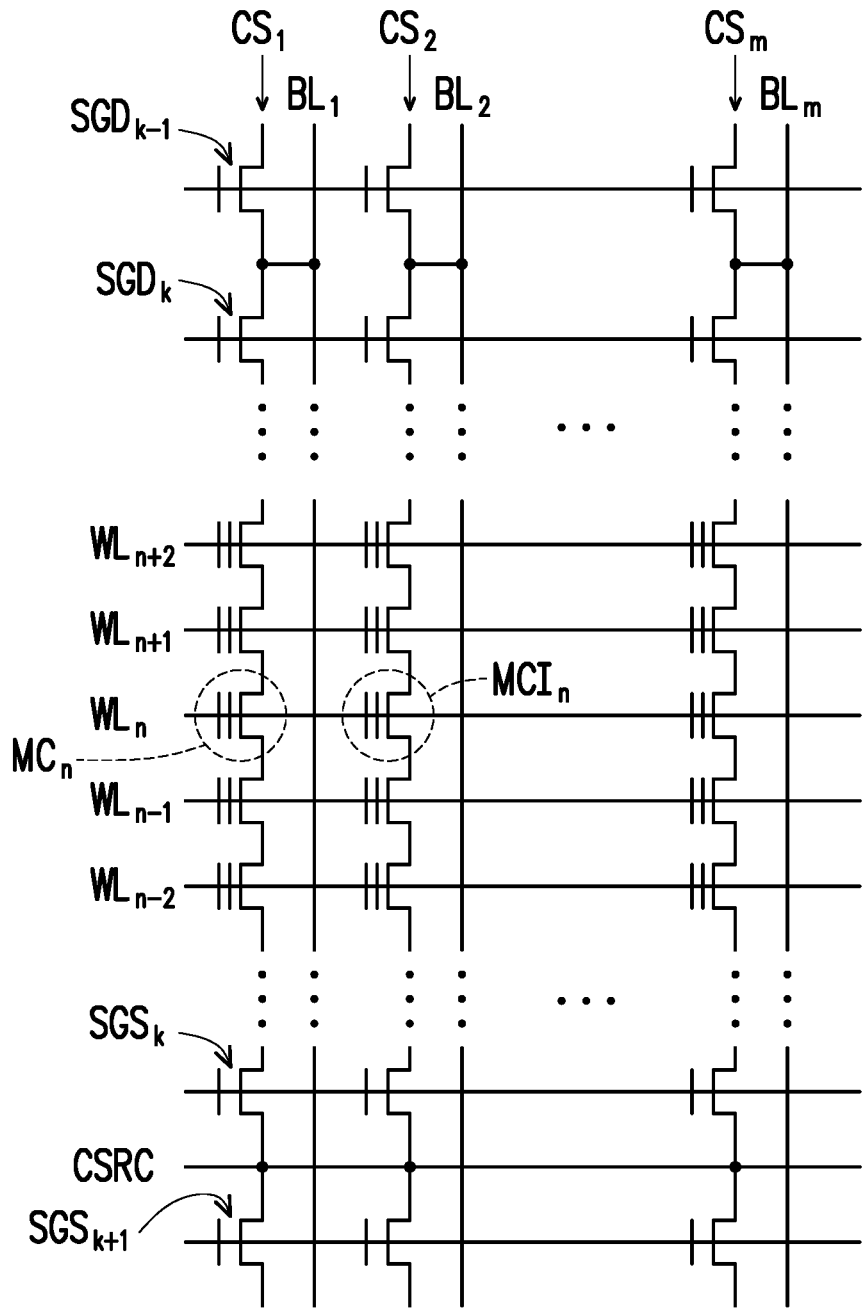
FIG. 3 shows elements in a memory cell array according to FIG. 2.

FIG. 2 shows a memory system according to an embodiment of the present invention, and FIG. 3 shows elements in a memory cell array according to FIG. 2. Please refer to FIG. 2 and FIG. 3 simultaneously, the memory system 10a of the present embodiment includes a memory device 100a, a controller 200a and a temperature sensor 300.

In some embodiments, the memory device 100a includes a memory cell array 110, an address decoder 120, a voltage generator 130, a page buffer 140 and a control logic 150.

The memory cell array 110 includes a plurality of strings of memory cells $CS_1$ to $CS_m$, wherein each of the strings of memory cells $CS_1$ to $CS_m$ is connected to bit lines $BL_1$ to $BL_m$ respectively. In some embodiments, each of the plurality of strings of memory cells $CS_1$ to $CS_m$ may include source selection gate transistors $SGS_k$ and $SGS_{k+1}$, a plurality of memory cells connected with one another in series, and drain selection gate transistors $SGD_k$ and $SGD_{k+1}$. The source selection gate transistors $SGS_k$ and $SGS_{k+1}$ are connected to source selection lines $SSL_k$ and $SSL_{k+1}$ respectively. The plurality of memory cells are connected to word lines $WL_{n-2}$ to $WL_{n+2}$ respectively. The drain selection gate transistors $SGD_k$ and $SGD_{k+1}$ are connected to drain selection lines $DSL_k$ and $DSL_{k+1}$ respectively. In addition, a source side of the source selection gate transistor $SGS_k$ is connected to a common source line CSRC, and a drain side of the drain selection gate transistor $SGD_k$ is connected to the corresponding bit line. In some embodiments, the common source line CSRC is commonly connected to the plurality of strings of memory cells $CS_1$ to $CS_m$.

In some embodiments, the drain selection lines $DSL_k$ and $DSL_{k+1}$, the word lines $WL_{n-2}$ to $WL_{n+2}$ and the source selection lines $SSL_k$ and $SSL_{k+1}$ are controlled by the address decoder 120. The bit lines $BL_1$ to $BL_m$ are controlled by the page buffer 140. The common source line CSRC is controlled by the control logic 150.

The address decoder 120 is coupled to the memory cell array 110. Specifically, the address decoder 120 is coupled to the memory cell array 110 by the drain selection lines $DSL_k$ and $DSL_{k+1}$, the word lines $WL_{n-2}$ to $WL_{n+2}$ and the source selection lines $SSL_k$ and $SSL_{k+1}$. In some embodiments, the address decoder 120 is configured to operate under control of the control logic 150. For example, the address decoder 120 may receive an address data from the outside by the control logic 150, wherein the address data may include a word line address and a bit line address. In some embodiments, the address decoder 120 includes a word line decoder (not shown) and a bit line decoder (not shown).

The word line decoder can be configured to decode the word line address so as to apply a pulse provided from the voltage generator 130 to the drain selection lines $DSL_k$ and $DSL_{k+1}$, the word lines $WL_{n-2}$ to $WL_{n+2}$ and the source selection lines $SSL_k$ and $SSL_{k+1}$ according to the decoded word line address. For example, during performing of a program operation, the word line decoder can apply a program pulse to a selected word line $WL_n$ so as to carry out the program operation on a selected memory cell $MC_n$ on the word line $WL_n$, while unselected memory cells (such as, memory cells $MCl_n$) need to be suppressed. A pass pulse less than the program pulse is applied to the unselected word lines $WL_{n-2}$, $WL_{n-1}$, $WL_{n+1}$ and $WL_{n+2}$. The bit line decoder can be configured to decode the bit line address so as to select one of memory cell columns in the memory cell array 110 according to the decoded bit line address.

The voltage generator 130 is coupled to the address decoder 120 and configured to generate the pulse provided to the strings of memory cells $CS_1$ to $CS_m$. In some embodiments, the voltage generator 130 includes a plurality of internal power sources. The plurality of internal power sources are started under the control of the control logic 150 to generate a plurality of pulses, wherein the plurality of generated pulses are applied to the word lines $WL_{n-2}$ to $WL_{n+2}$ by the address decoder 120.

The page buffer 140 is coupled to the memory cell array 110. In some embodiments, the page buffer 140 may include a plurality of page buffer units (not shown) connected to the bit lines $BL_1$ to $BL_m$ respectively, and operates under the control of the control logic 150. For example, during the program operation, the page buffer 140 receives a program data from the control logic 150. When the program pulse is applied to the selected word line $WL_n$, the page buffer 140 sends the above program data to selected memory cells by the bit lines $BL_1$ to $BL_m$.

The control logic 150 is coupled to the address decoder 120, the voltage generator 130 and the page buffer 140. In some embodiments, the control logic 150 receives a program command and the address data from the controller 200a, and controls the address decoder 120, the voltage generator 130 and the page buffer 140 in response to the program command. In addition, the control logic 150 sends the above address data to the address decoder 120.

The controller 200a is coupled to the memory device 100a and configured to propose the program command to the memory device 100a. In some embodiments, the controller 200a receives a program command from a host device (not shown) to control the memory device 100a.

The temperature sensor 300 is located in the memory device 100a, and coupled to the control logic 150. The temperature sensor 300 is configured to acquire a temperature data TD of the memory device 100a. In the present embodiment, after sensing a temperature of the memory device 100a in a specific time interval and generating the temperature data TD, the temperature sensor 300 supplies the temperature data TD generated by the temperature sensor 300 to the voltage generator 130 by the control logic 150 in response to an instruction of the control logic 150, so that the voltage generator 130 can generate various pulses according to the temperature data TD.

In the present embodiment, the temperature sensor 300 converts the temperature of the memory device 100a into the temperature data TD, wherein the temperature data TD is a temperature code of n bits, and n is a natural number greater than or equal to 1. Exemplary embodiments are listed below to illustrate the situation that the temperature data TD is a temperature code of 3 bits, but it should be noted that the present invention is not limited to this.

TABLE 1

| Temperature codes | Temperature ranges of the memory device 100a |
|---|---|
| 000 | Less than −45° C. (a first temperature value) |
| 001 | Greater than −45° C. (the first temperature value) and less than −15° C. (a second temperature value) |
| 010 | Greater than −15° C. (the second temperature value) and less than 15° C. (a third temperature value) |
| 011 | Greater than 15° C. (the third temperature value) and less than 45° C. (a fourth temperature value) |
| 100 | Greater than 45° C. (the fourth temperature value) and less than 75° C. (a fifth temperature value) |
| 101 | Greater than 75° C. (the fifth temperature value) and less than 105° C. (a sixth temperature value) |
| 110 | Greater than 105° C. (the sixth temperature value) and less than 135° C. (a seventh temperature value) |
| 111 | Greater than 135° C. (the seventh temperature value) |

As shown in Table 1, when the temperature data TD is the temperature code of 3 bits, seven temperature values are selected to divide the range of the temperature into eight parts (the third power of 2) to convert the temperature data TD. In the present embodiment, the seven temperature values are respectively −45° C. (the first temperature value), −15° C. (the second temperature value), 15° C. (the third temperature value), 45° C. (the fourth temperature value), 75° C. (the fifth temperature value), 105° C. (the sixth temperature value), and 135° C. (the seventh temperature value). The first bit of the temperature code is configured to judge a relationship between the temperature of the memory device 100a and the fourth temperature value (namely 45° C., the descriptions of similar situations are omitted below). For example, the first bit of the temperature code is "1" when the temperature of the memory device 100a is higher than the fourth temperature value. Relatively, the first bit of the temperature code is "0" when the temperature of the memory device 100a is lower than the fourth temperature value. The second bit of the temperature code continues to be configured to judge relationships between the temperature of the memory device 100a and the second temperature value as well as the sixth temperature value. Specifically, the relationship between the temperature of the memory device 100a and the second temperature value is compared when the first bit of the temperature code is "0", and the relationship between the temperature of the memory device 100a and the sixth temperature value is compared when the first bit of the temperature code is "1". For example, the second bit of the temperature code is "1" when the temperature of the memory device 100a is higher than the second temperature value or the sixth temperature value. Relatively, the first bit of the temperature code is "0" when the temperature of the memory device 100a is lower than the second temperature value or the sixth temperature value. The third bit of the temperature code continues to be configured to judge relationships between the temperature of the memory device 100a and the first temperature value, the third temperature value, the fifth sixth temperature value as well as the seventh temperature value. Specifically, the relationship between the temperature of the memory device 100a and the first temperature value is compared when both of the first bit and the second bit of the temperature code are "0". The relationship between the temperature of the memory device 100a and the third temperature value is compared when the first bit of the temperature code is "0" and the second bit of the temperature code is "1". The relationship between the temperature of the memory device 100a and the fifth temperature value is compared when the first bit of the temperature code is "1" and the second bit of the temperature code is "0". The relationship between the temperature of the memory device 100a and the seventh temperature value is compared when the first bit and the second bit of the temperature code is "1". For example, the third bit of the temperature code is "1" when the temperature of the memory device 100a is higher than the first temperature value, the third temperature value, the fifth temperature value or the seventh temperature value. Relatively, the third bit of the temperature code is "0" when the temperature of the memory device 100a is lower than the first temperature value, the third temperature value, the fifth temperature value or the seventh temperature value.

For example, the temperature of the memory device 100a is judged to be greater than the fourth temperature value when being 80° C., and thus the first bit of the temperature code is "1". Hereafter, the relationship between the temperature of the memory device 100a and the sixth temperature value is compared under the situation that the first bit of the temperature code is "1", the temperature of the memory device 100a is judged to be less than the sixth temperature value, and thus the second bit of the temperature code is "0". Then, the relationship between the temperature of the memory device 100a and the fifth temperature value is compared under the situation that the first bit of the temperature code is "1" and the second bit of the temperature code is "0", the temperature of the memory device 100a is judged to be less than the fifth temperature value, and thus the third bit of the temperature code is "0". Based on this, the temperature sensor 300 converts the temperature of the memory device 100a into a temperature code "100", which is supplied to the voltage generator 130 by the control logic 150, so that the voltage generator 130 can generate desired pulses according to this. In the present embodiment, widths of the program pulse and the pass pulse generated by the voltage generator 130 become narrower as the temperature of the memory device 100a is raised. In addition, in some embodiments, amplitudes of the program pulse and the pass pulse generated by the voltage generator 130 become larger as the temperature of the memory device 100a is raised. In summary, widths or amplitudes of the pulses generated by the voltage generator 130 will be changed along with the temperature of the memory device 100a, and the descriptions thereof will be described in detail in embodiments below.

Figure 4:
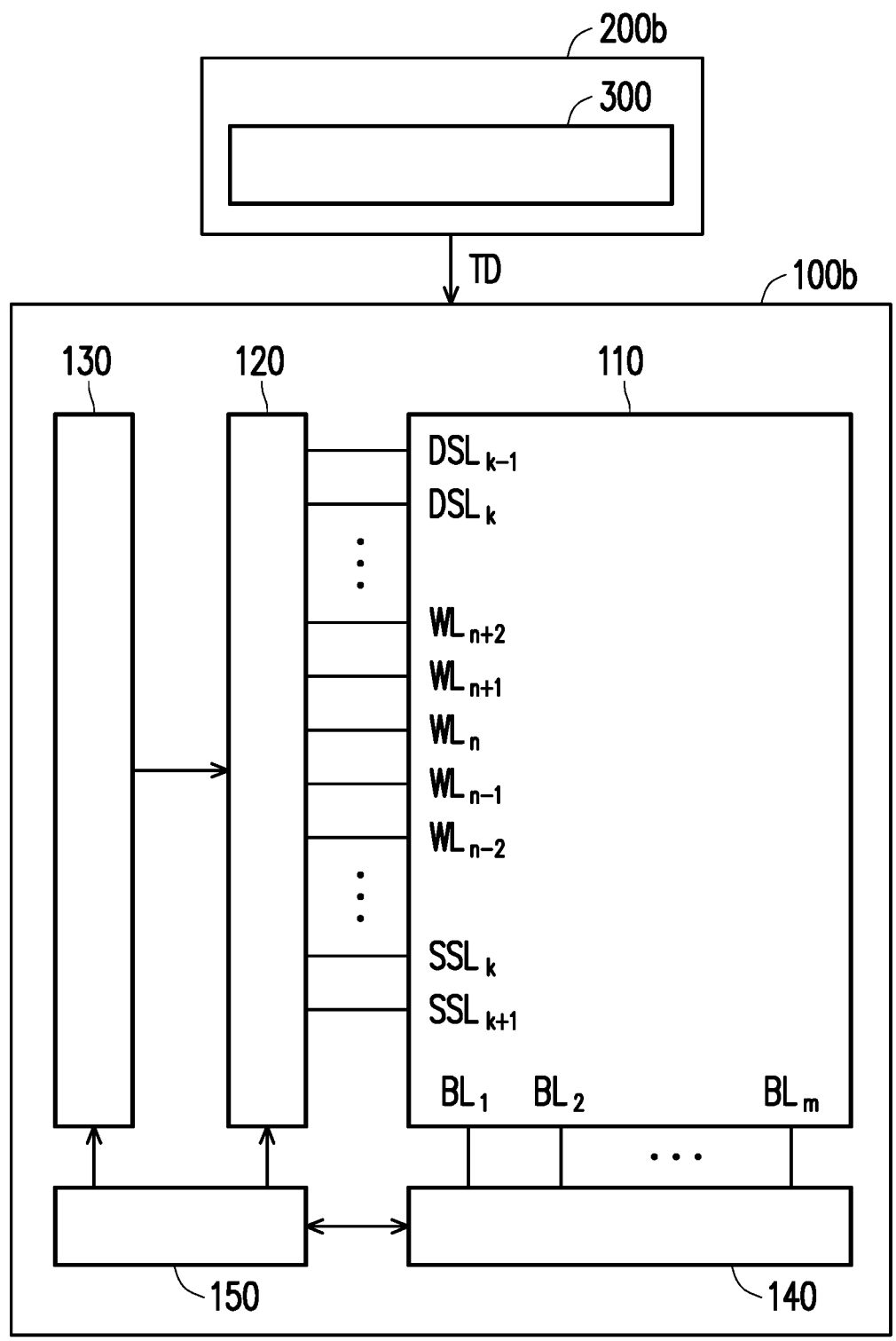
FIG. 4 shows a memory system according to another embodiment of the present invention.

FIG. 4 shows a memory system according to another embodiment of the present invention. It must be illustrated herein that the embodiment of FIG. 4 follows element labels and partial contents of the embodiment of FIG. 2, wherein the same or similar labels are adopted to denote the same or similar elements, and the illustrations of the same technical content are omitted. The illustrations related to omissions may refer to the descriptions and effects of the foregoing embodiments, the descriptions thereof are omitted in embodiments below. At least a part of non-omitted descriptions in the embodiment of FIG. 4 may refer to subsequent contents.

Please refer to FIG. 4, in the embodiment shown in FIG. 4, the difference between a memory system 10b and the memory system 10a is that a temperature sensor 300 of the present embodiment is arranged in a controller 200b instead of being arranged in the memory device 100b. In this case, the controller 200b can directly send an instruction to the temperature sensor 300 so as to acquire a temperature data TD of a memory device 100b. After the temperature data TD of the memory device 100b is acquired, the controller 200b proposes a program command to the memory device 100b, and the control logic 150 controls the voltage generator 130 to generate various desired pulses according to the temperature data TD in response to the program command.

Figure 5:
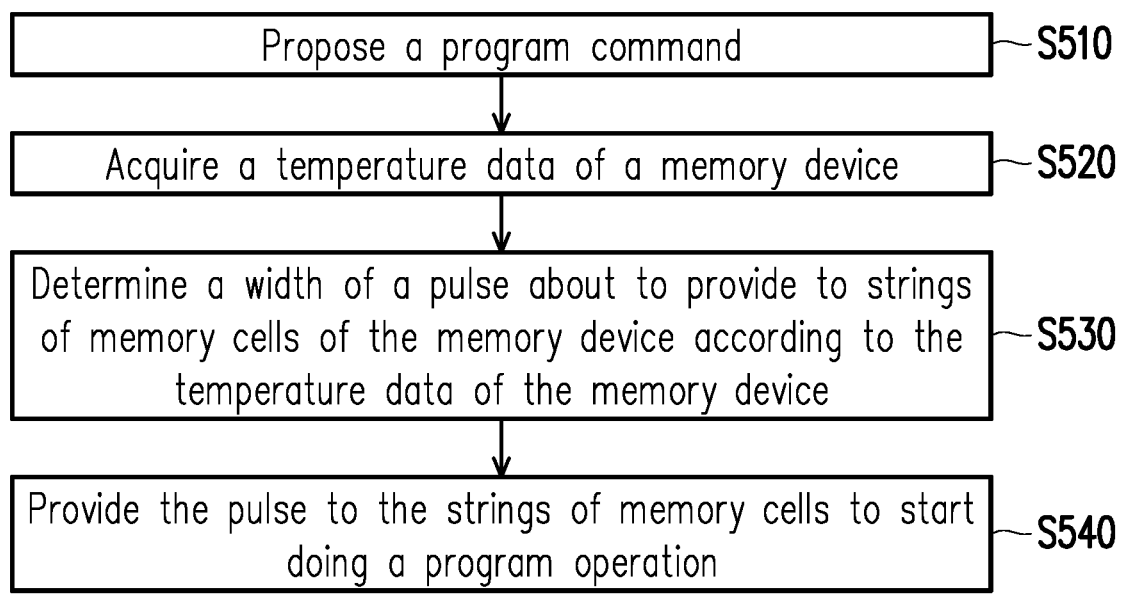
FIG. 5 shows a flow diagram of a method for programming a memory device according to an embodiment of the present invention.

Please refer to FIG. 5, FIG. 5 shows a flow diagram of a method for programming a memory device according to an embodiment of the present invention. The memory device described in FIG. 5 takes the above memory device 100a as an example, but it should be noted that the present invention is not limited to this.

The method 500 for programming the memory device of the present embodiment includes steps below. First, in step S510, a program command is proposed. Second, in step S520, a temperature data of the memory device is acquired. Third, in step S530, a width of a pulse about to provide to strings of memory cells of the memory device is determined according to the temperature data of the memory device. Then, in step S540, the pulse is provided to the strings of memory cells to start doing a program operation. It is illustrated in advance herein that performing modes of step S510 and step S520 may refer to the above embodiments, and the descriptions thereof are omitted below.

Figure 6:
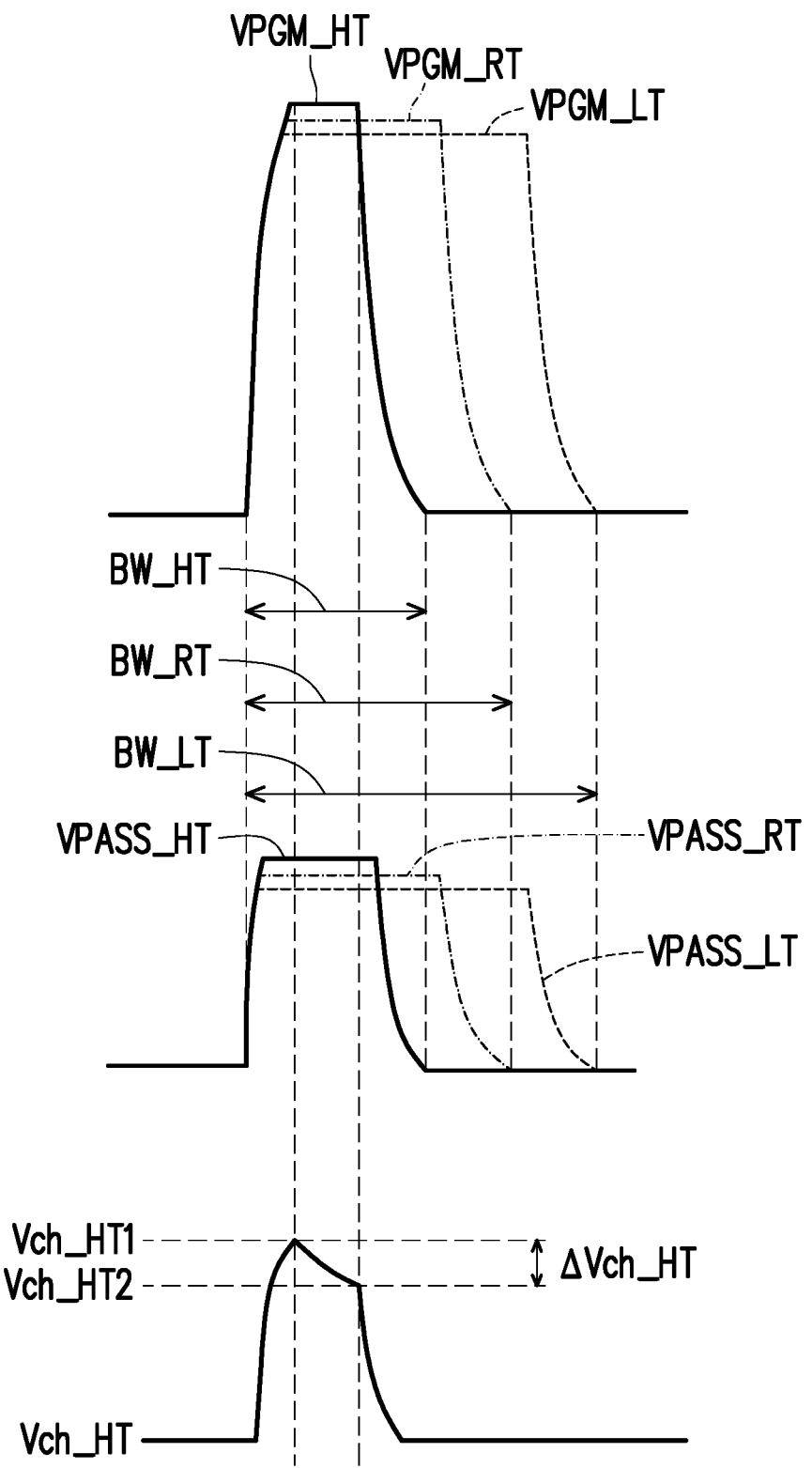
FIG. 6 shows a voltage oscillogram of a memory device according to an embodiment of the present invention when a program operation is carried out at different temperatures.

Please refer to FIG. 5, FIG. 6 and Table 1 synchronously herein, wherein FIG. 6 shows a voltage oscillogram of a memory device according to an embodiment of the present invention when a program operation is carried out at different temperatures.

When step S530 is performed, a width of a pulse to be generated by the voltage generator 130 becomes narrower as the temperature of the memory device 100a is raised. For example, if the temperature of the memory device 100a is a relatively high temperature (for example, higher than the seventh temperature value), a program pulse VPGM_HT to be applied to the selected word line $WL_n$ is determined to have a width BW_HT, and pass pulses VPASS_HT to be applied to the unselected word lines $WL_{n-2}$, $WL_{n-1}$, $WL_{n+1}$ and $WL_{n+2}$ are also determined to have the width BW_HT. If the temperature of the memory device 100a is a room temperature (for example, about the fourth temperature value), a program pulse VPGM_RT to be applied to the selected word line $WL_n$ is determined to have a width BW_RT, and pass pulses VPASS_RT to be applied to the unselected word lines $WL_{n-1}$, $WL_{n+1}$ and $WL_{n+2}$ are also determined to have the width BW_RT. If the temperature of the memory device 100a is a relatively low temperature (for example, lower than the first temperature value), a program pulse VPGM_LT to be applied to the selected word line $WL_n$ is determined to have a width BW_LT, and pass pulses VPASS_LT to be applied to the unselected word lines $WL_{n-1}$, $WL_{n+1}$ and $WL_{n+2}$ are also determined to have the width BW_LT. In the present embodiment, BW_HT<BW_RT<BW_LT. In addition, in some embodiments, an amplitude of the pulse to be generated by the voltage generator 130 may become larger as the temperature of the memory device 100a is raised, as shown in FIG. 6.

Exemplary embodiments are listed below to illustrate the relationship between the temperature of the memory device and the width of the program pulse, but it should be noted that the present invention is not limited to this.

TABLE 2

| Temperature ranges of the memory device 100a | Widths of the program pulse |
| --- | --- |
| Less than −45° C. | Preset time + 3 * a compensation value |
| Greater than −45° C and less than −15° C. | Preset time + 2 * the compensation value |
| Greater than −15° C. and less than 15° C. | Preset time + 1 * the compensation value |
| Greater than 15° C. and less than 45° C. | Preset time |
| Greater than 45° C. and less than 75° C. | Preset time − 1 * the compensation value |
| Greater than 75° C. and less than 105° C. | Preset time − 2 * the compensation value |
| Greater than 105° C. and less than 135° C. | Preset time − 3 * the compensation value |
| Greater than 135° C. | Preset time − 4 * the compensation value |

The preset time in above Table 2 may be 10 microseconds, and the compensation value may be 1 microsecond. However, it should be noted that data in Table 2 are only examples, and not configured to limit the present invention. In summary, the width of the program pulse to be generated by the voltage generator 130 of the present embodiment will become narrower as the temperature of the memory device 100a is raised.

When step S540 is performed, the desired pulse is provided according to the temperature of the memory device 100a. In the present embodiment, the program operation is about to be carried out on the memory cell $MC_n$ on the word line $WL_n$ and therefore, the memory cell $MCI_n$ on the same word line $WL_n$ needs to be suppressed.

When the program operation is carried out with the temperature of the memory device 100a being the relatively high temperature, the selected word line $WL_n$ receives the program pulse VPGM_HT from the voltage generator 130. In a process of the program operation, a value of a channel potential Vch_HT of the memory cell $MCI_n$ is decreased from Vch_HT1 to Vch_HT2 due to generation of a leak current. However, the width BW_HT of the program pulse VPGM_HT is short (that is, program time is short), therefore, a decrease amplitude amount ΔVch_HT of the channel potential Vch_HT of the memory cell $MCI_n$ is relatively small (compared with the prior art) due to an influence of the leak current. In this way, an ability to prevent program interference is avoided being lowered when the memory cell $MCI_n$ is affected greatly by the leak current.

When the program operation is carried out with the temperature of the memory device 100a being the room temperature, the selected word line $WL_n$ receives the program pulse VPGM_RT from the voltage generator 130. Due to the relatively small decrease amplitude of the channel potential of the memory cell $MCI_n$ at this temperature, the width BW_RT of the program pulse VPGM_RT may be reduced non-deliberately, that is, the ability of the memory cell $MCI_n$ to avoid the program interference at this temperature is not affected.

When the program operation is carried out with the temperature of the memory device 100a being the relatively low temperature, the selected word line $WL_n$ receives the program pulse VPGM_LT from the voltage generator 130. Due to the smaller decrease amplitude of the channel potential of the memory cell $MCI_n$ at this temperature, the width BW_LT of the program pulse VPGM_LT may be increased selectively, so that the amplitude of the program pulse VPGM_LT provided by the voltage generator 130 may be decreased. In addition, the ability of the memory cell $MCI_n$ to prevent the program interference at this temperature is not affected either. Based on this, the channel potential of the memory cell $MCI_n$ is less affected by the leak current when the program operation is carried out on the memory device 100a at the low temperature. Therefore, a large-amplitude bias voltage of the memory device 100a used at the high temperature can be compensated by increasing the width BW_LT of the program pulse VPGM_LT applied to the selected word line $WL_n$.

In addition, the pass pulses VPASS_HT, VPASS_RT and VPASS_LT also respectively have different widths as the temperature changes, the relationships thereof are as described in the above embodiments, and the descriptions thereof are omitted herein.

Figure 7:
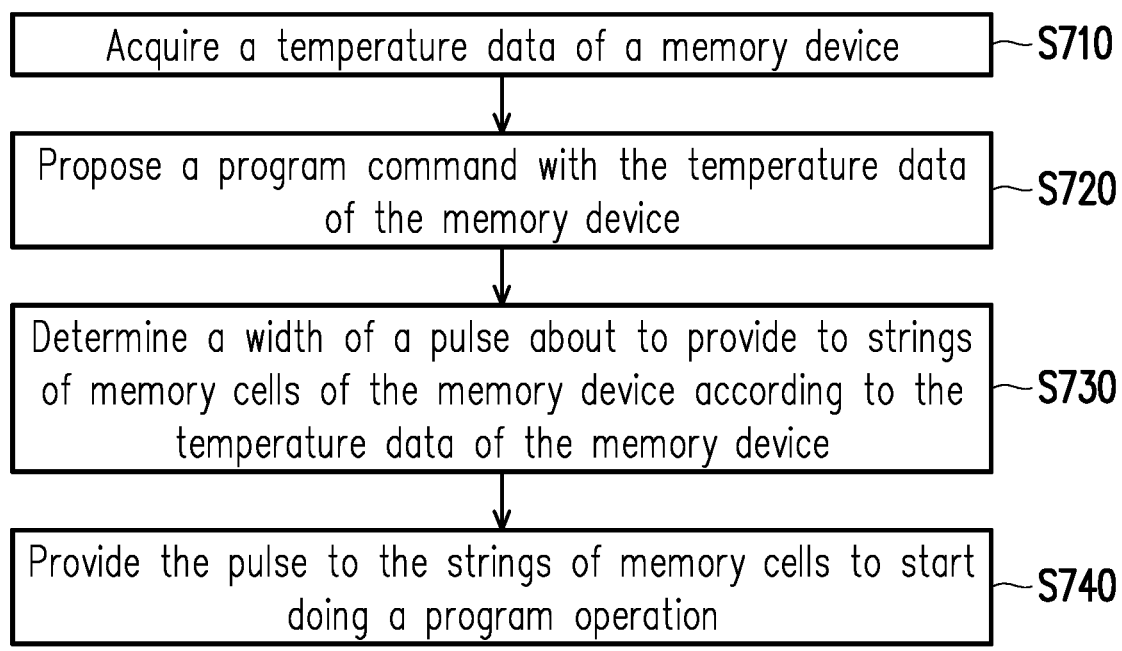
FIG. 7 shows a flow diagram of a method for programming a memory device according to another embodiment of the present invention.

Please refer to FIG. 7, FIG. 7 shows a flow diagram of a method for programming a memory device according to another embodiment of the present invention. The memory device described in FIG. 7 takes the above memory device 100b as an example, but it should be noted that the present invention is not limited to this. It must be illustrated herein that the embodiment of FIG. 7 follows element labels and partial contents of the embodiment of FIG. 5, wherein the same or similar labels are adopted to denote the same or similar elements, and the illustrations of the same technical content are omitted. The illustrations related to omissions may refer to the descriptions and effects of the foregoing embodiments, and the descriptions thereof are omitted in embodiments below. At least a part of non-omitted descriptions in the embodiment of FIG. 7 may refer to the subsequent contents.

Please refer to FIG. 7, first, in step S710, a temperature data of the memory device is acquired. Second, in step S720, a program command with the temperature data of the memory device is proposed. Third, in step S730, a width of a pulse about to provide to strings of memory cells of the memory device is determined according to the temperature data of the memory device. Then, in step S740, the pulse is provided to the strings of memory cells to start doing a program operation.

The main difference between the programming method 700 of the present embodiment and the programming method 500 is that the programming method 700 of the present embodiment proposes the program command to the memory device 100b according to the temperature data TD after acquiring the temperature data TD of the memory device 100b firstly.

It is worth noting that the above embodiments of the case may be applied to a two-dimensional nand gate flash memory or a three-dimensional nand gate flash memory. In addition, the above embodiments of the case may be applied to a single-level cell (SLC), a multi-level cell (MLC), a triple-level cell (TLC) or a quad-level cell (QLC).

Based on the foregoing, according to the method for programming the memory device of the present invention, the width of the pulse applied to the strings of memory cells becomes narrower as the temperature of the memory device is raised, therefore, when the program operation is carried out on the memory device of the present invention at the high temperature, the width of the program pulse applied to the selected word line is relatively small and thus a program speed of the selected memory cell is increased. Based on this, the influence on the unselected memory cells on the same word line by the leak current may be reduced, that is, the decrease amplitude amount of the channel potential of the unselected memory cells is relatively small so as to make the unselected memory cells still have the ability to prevent the program interference. In addition, when the program operation is carried out on the memory device of the present invention at the low temperature, the decrease amplitude amount of the channel potential of the memory cells is less affected by the leak current, therefore, the width of the program pulse applied to the selected word line may be increased to compensate for the large-amplitude bias voltage of the memory device of the present invention used at the high temperature.

What is claimed is:

1. A method for programming a flash memory device, comprising:
    proposing a program command;
    determining a width of a pulse about to provide to strings of memory cells of the flash memory device according to a temperature data of the flash memory device; and
    providing the pulse to the strings of memory cells to start doing a program operation,
    wherein in the step of providing the pulse to the strings of memory cells, the pulse comprises a program pulse and a pass pulse, the program pulse is provided to the strings of memory cells by a selected word line, and the pass pulse is provided to the strings of memory cells by unselected word lines,
    wherein the width of the pass pulse becomes narrower as a temperature of the flash memory device is raised.

2. The method for programming the flash memory device according to claim 1, wherein the temperature data of the flash memory device is acquired after the program command is proposed.

3. The method for programming the flash memory device according to claim 1, wherein the temperature data of the flash memory device is acquired before the program command is proposed.

4. The method for programming the flash memory device according to claim 1, wherein the temperature data of the flash memory device is a temperature code of n bits, and n is a natural number greater than or equal to 1.

5. The method for programming the flash memory device according to claim 1, wherein an amplitude of the program pulse becomes larger as the temperature of the flash memory device is raised.

6. The method for programming the flash memory device according to claim 1, wherein an amplitude of the pass pulse becomes larger as the temperature of the flash memory device is raised.

7. A flash memory system, comprising:
    a flash memory device, comprising:
        a memory cell array, comprising a plurality of strings of memory cells;
        an address decoder, coupled to the memory cell array;
        a voltage generator, coupled to the address decoder and configured to generate a pulse provided to the strings of memory cells;
        a page buffer, coupled to the memory cell array; and
        a control logic, coupled to the address decoder, the voltage generator and the page buffer;
    a controller, coupled to the flash memory device, and configured to propose a program command to the flash memory device; and
    a temperature sensor, configured to acquire a temperature data of the flash memory device, wherein the temperature sensor is located in the flash memory device or the controller,
    wherein the control logic determines a width of the pulse about to provide to the plurality of strings of memory cells of the flash memory device according to the temperature data of the flash memory device,
    wherein the pulse comprises a program pulse and a pass pulse, the program pulse is provided to a selected memory cell in the strings of memory cells by a selected word line, and the pass pulse is provided to unselected memory cells in the strings of memory cells by unselected word lines,
    wherein the width of the pass pulse becomes narrower as a temperature of the flash memory device is raised.

8. The flash memory system according to claim 7, wherein the temperature data of the flash memory device is a temperature code of n bits, and n is a natural number greater than or equal to 1.

9. The flash memory system according to claim 7, wherein an amplitude of the program pulse becomes larger as the temperature of the flash memory device is raised.

10. The flash memory system according to claim 7, wherein an amplitude of the pass pulse becomes larger as the temperature of the flash memory device is raised.

* * * * *